(12) United States Patent
Hendriks et al.

(10) Patent No.: US 12,414,241 B2
(45) Date of Patent: Sep. 9, 2025

(54) TRANSFERRING VISCOUS MATERIALS

(71) Applicant: Nederlandse Organisatie voor toegepast-natuurwetenschappelijk onderzoek TNO, 's-Gravenhage (NL)

(72) Inventors: Rob Jacob Hendriks, Eindhoven (NL); Fabien Bernard Jacques Bruning, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 88 days.

(21) Appl. No.: 17/923,258

(22) PCT Filed: May 12, 2021

(86) PCT No.: PCT/NL2021/050309
§ 371 (c)(1),
(2) Date: Nov. 4, 2022

(87) PCT Pub. No.: WO2021/230746
PCT Pub. Date: Nov. 18, 2021

(65) Prior Publication Data
US 2023/0240017 A1   Jul. 27, 2023

(30) Foreign Application Priority Data

May 12, 2020   (EP) .................................. 20174175

(51) Int. Cl.
*H05K 3/12*     (2006.01)
*H05B 1/02*     (2006.01)
*H05B 3/22*     (2006.01)

(52) U.S. Cl.
CPC ......... *H05K 3/1258* (2013.01); *H05B 1/0244* (2013.01); *H05B 3/22* (2013.01);
(Continued)

(58) Field of Classification Search
None
See application file for complete search history.

(56) References Cited

U.S. PATENT DOCUMENTS 3,729,819 A * 5/1973 Horie .................... H05K 3/207
                                                                174/254
4,956,653 A * 9/1990 Braun .................. B41J 2/14129
                                                                347/64
(Continued)

FOREIGN PATENT DOCUMENTS

EP        1710897 A2    10/2006
JP        61254350      11/1986
(Continued)

OTHER PUBLICATIONS

European Patent Office, International Search Report in corresponding International Application No. PCT/NL2021/050309, dated Jul. 23, 2021 (3 pages).

(Continued)

*Primary Examiner* — Thor S Campbell
(74) *Attorney, Agent, or Firm* — Leydig, Voit & Mayer, Ltd.

(57) ABSTRACT

A method and device are described to transfer a viscous functional material onto a receiving substrate. A plate is provided having a cavity surface that includes a cavity. A plurality of individually addressable resistive heater elements are provided that are in thermal contact with respective zones of the cavity. Viscous functional material is provided in the cavity with a material composition that, when sufficiently heated, generates a gas at an interface between the cavity surface in the cavity and the functional material, to transfer the functional material from the cavity by the gas generation onto the receiving substrate. Respective portions of the viscous functional material in respective zones of the cavity are heated by supplying respective ones (Continued)

of the plurality of individually addressable heater elements with an electric power having a respective time dependent magnitude.

17 Claims, 15 Drawing Sheets

(52) U.S. Cl.
CPC .. *H05B 2203/005* (2013.01); *H05B 2203/019* (2013.01); *H05K 2203/1105* (2013.01)

(56) References Cited

U.S. PATENT DOCUMENTS

| | | | |
|---|---|---|---|
| 4,991,287 A * | 2/1991 | Piatt | H05K 3/3478 216/17 |
| 5,598,189 A * | 1/1997 | Hess | B41J 2/04543 347/57 |
| 5,760,808 A | 6/1998 | Wiedemer | |
| 6,140,009 A * | 10/2000 | Wolk | G02B 6/1221 430/964 |
| 6,936,774 B2 * | 8/2005 | Sugaya | H05K 3/205 174/262 |
| 9,750,141 B2 | 8/2017 | Noy | |
| 2002/0084315 A1 * | 7/2002 | MaCkay | B23K 1/0016 228/248.1 |
| 2011/0097550 A1 | 4/2011 | Matusovsky et al. | |
| 2012/0086764 A1 | 4/2012 | Golda et al. | |
| 2014/0117067 A1 * | 5/2014 | Sato | B23K 3/0638 228/33 |
| 2015/0351250 A1 * | 12/2015 | Kella | G03G 15/24 156/349 |
| 2017/0013724 A1 | 1/2017 | Noy | |
| 2017/0268100 A1 * | 9/2017 | Hendriks | H05K 3/046 |
| 2018/0171468 A1 | 6/2018 | Hendriks et al. | |
| 2021/0237184 A1 * | 8/2021 | Zenou | B23K 3/0638 |
| 2021/0245538 A1 * | 8/2021 | Tzomik | B32B 27/12 |
| 2023/0209722 A1 * | 6/2023 | Hendriks | H05K 3/207 29/825 |
| 2023/0240017 A1 * | 7/2023 | Hendriks | H05K 3/046 |

FOREIGN PATENT DOCUMENTS

| | | |
|---|---|---|
| JP | H07218716 A | 8/1995 |
| JP | H09511459 A | 11/1997 |
| JP | 2005305966 A | 11/2005 |
| KR | 20170028869 A | 3/2017 |
| KR | 20190099042 A | 8/2019 |
| WO | 2016014138 A1 | 1/2016 |
| WO | 2018118114 A1 | 6/2018 |

OTHER PUBLICATIONS

Muhann Patent & Law Firm, Notice of Preliminary Rejection in corresponding Korean Application dated Jun. 27, 2025.

* cited by examiner

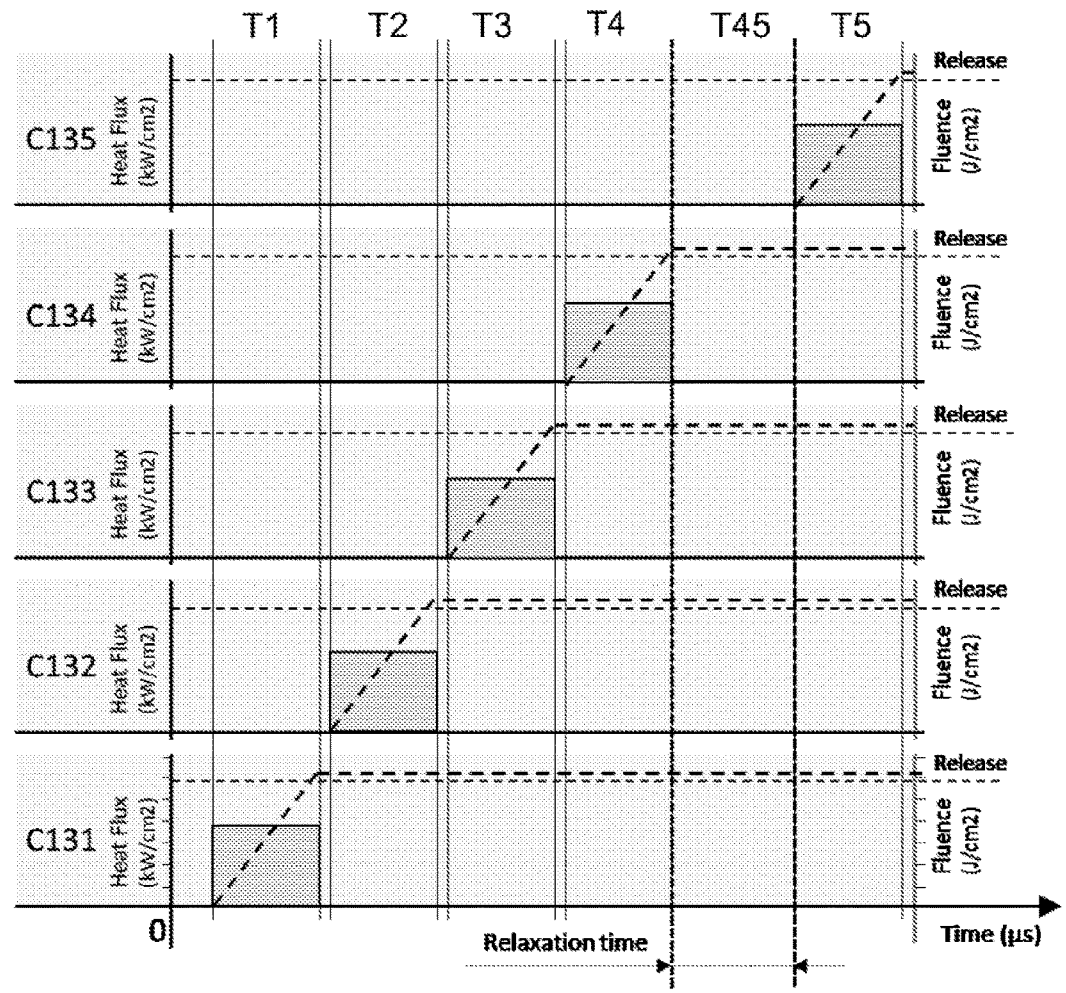
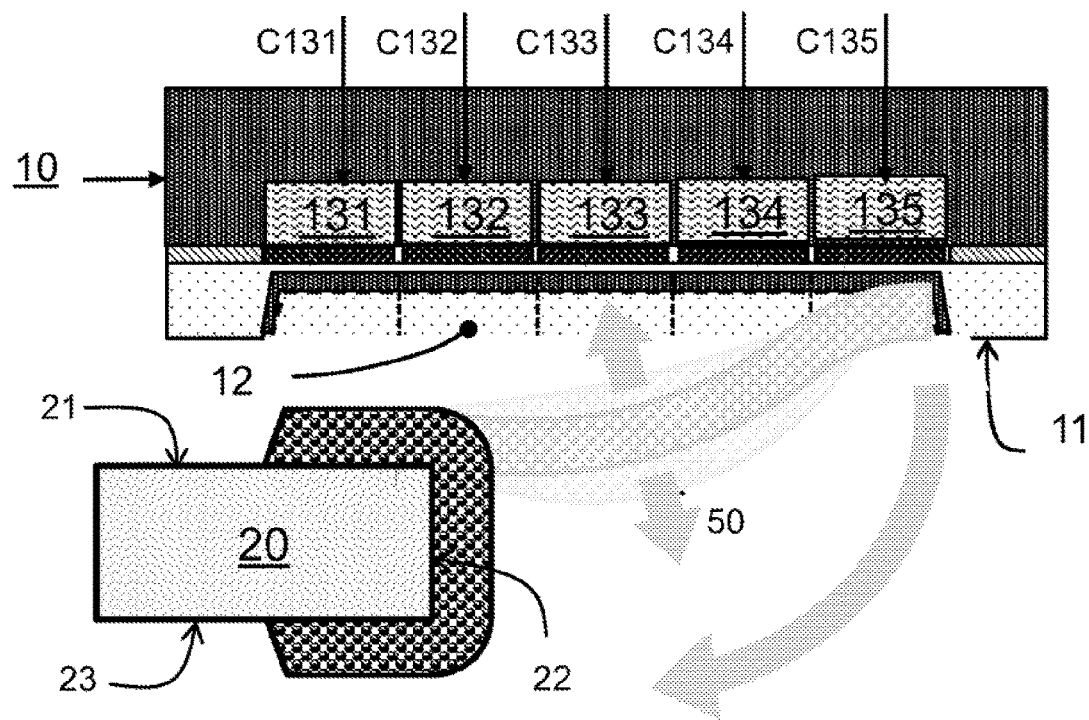
FIG. 3

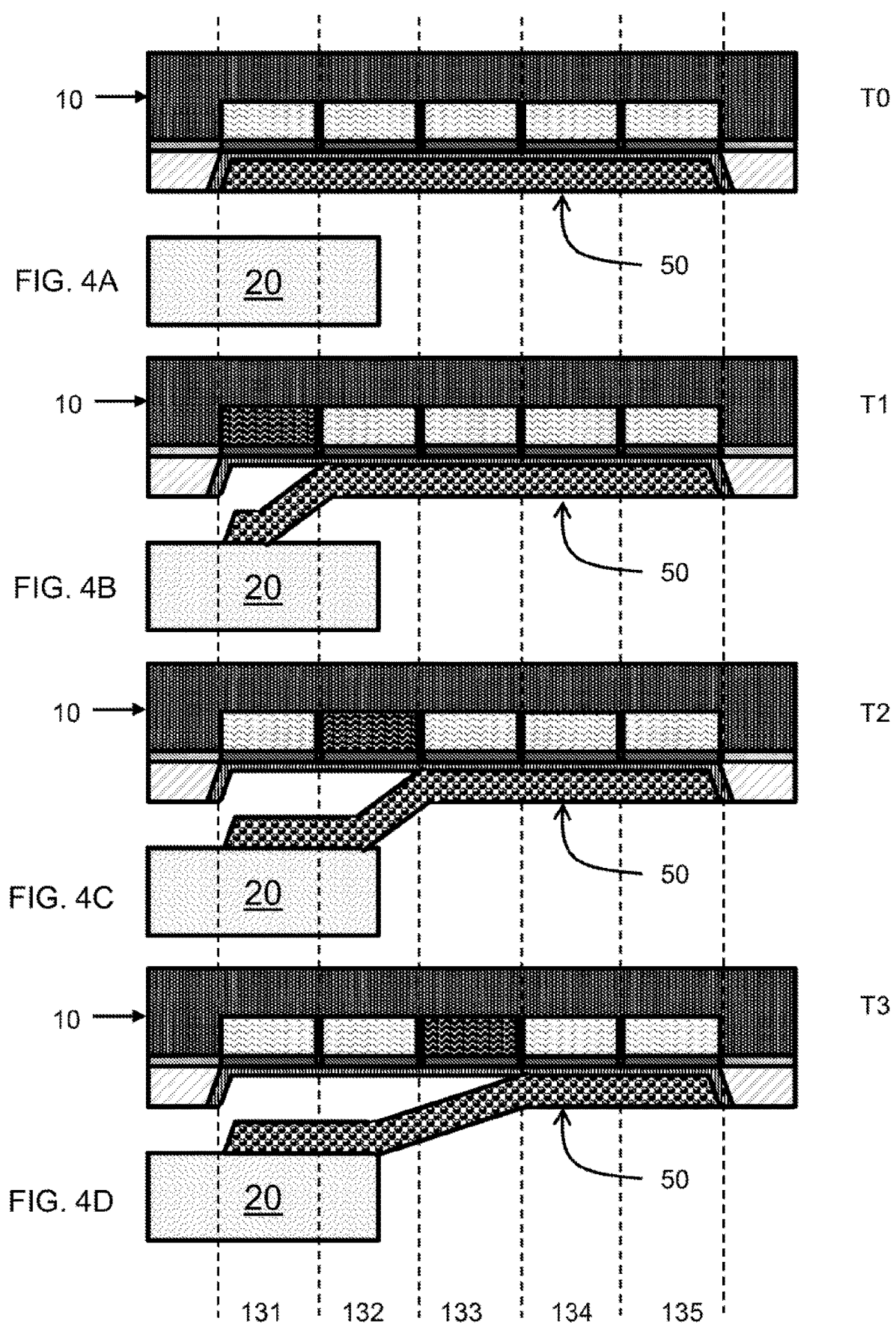

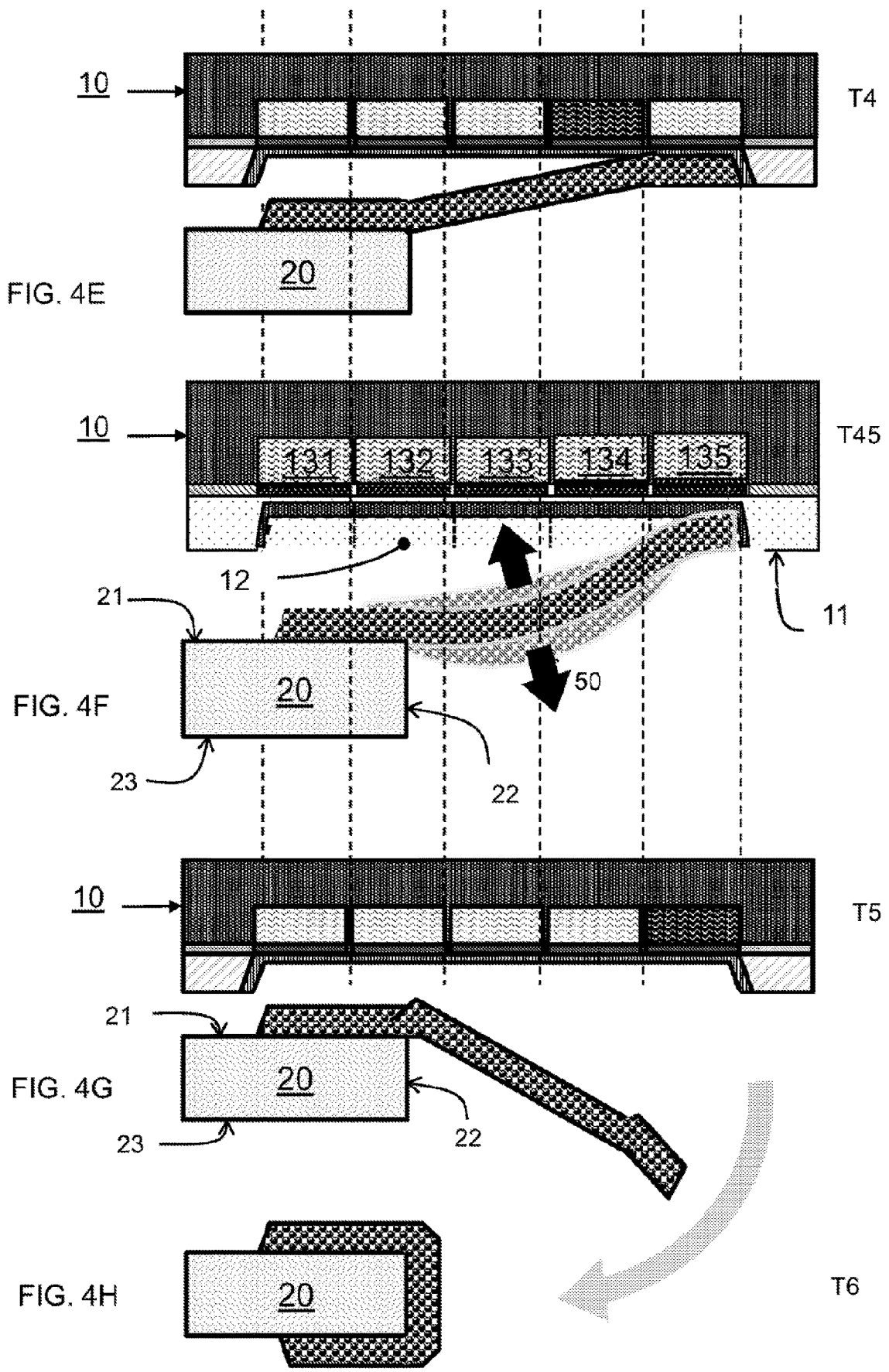

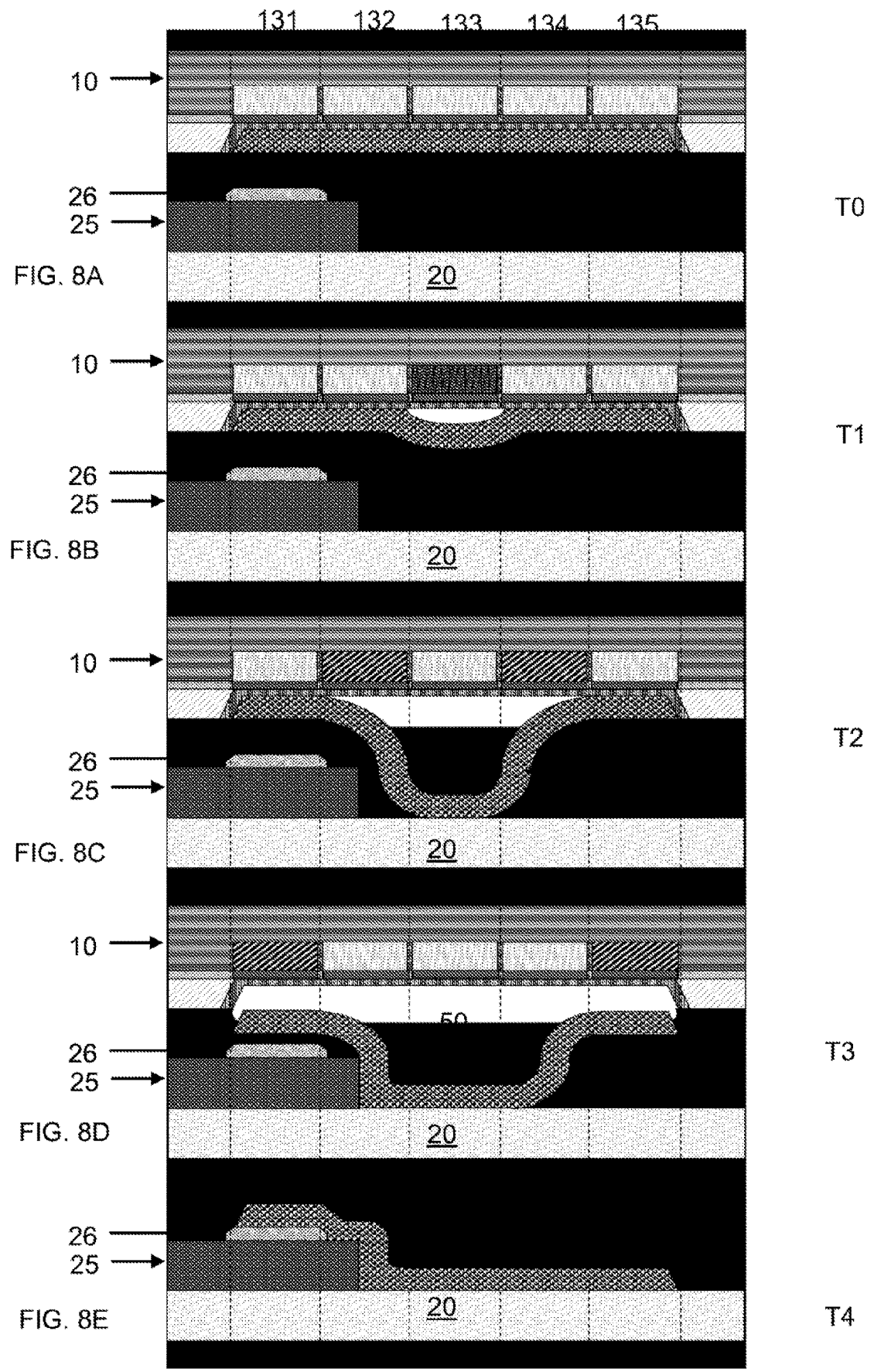

TRANSFERRING VISCOUS MATERIALS

CROSS-REFERENCE TO RELATED APPLICATIONS

This patent application is a U.S. National Phase of PCT International Application No. PCT/NL2021/050309, filed May 12, 2021, which claims priority to European Application No. 20174175.8, filed May 12, 2020, which are both expressly incorporated by reference in their entireties, including any references contained therein.

FIELD OF INVENTION

The invention relates to a method of transferring a high viscosity functional material, such as an electrically conductive or an electrically insulating paste, on a substrate.

The invention further relates to a device for transferring such a material.

The invention still further relates to a record carrier comprising instructions that when executed by a programmable processor causes an apparatus to perform the method.

BACKGROUND

Interconnection of discrete bare chip components or microelectronic components (chips) on a substrate is a process for which precision material deposition with sufficient accuracy is necessary to allow for miniature electrical or other type of interconnects so that when a chip component becomes attached to a placement position all electrical connection and fixation to the substrate can be made by a conductive material or paste. An example of a conductive adhesives is a thermal or UV settable resin loaded with silver particles, or a solder paste comprising solder particles and flux. Alternatively it may be desired to locally deposit an insulating element, for example to electrically insulate an electric conductor from another, crossing electric conductor. Still further the functional material to be deposited may be a thermal conductor, or instead a thermal insulator.

Printing is an example of a common method for selectively depositing a functional material on a substrate. Typically a functional material needs to be formulated with other materials before the functional material can be printed on a substrate. A formulation can e.g. be formed by dispersing the functional material in a solvent or liquid; thus, the formulation is generally wet. The formulation is often referred to as an ink or paste, depending on the viscosity. A challenge exists to transfer such functional materials, since ideally, instead of printing a functional ink material on a substrate, selectively depositing only the pure functional material on a substrate is most preferable. Such materials e.g. consist of more than 50 vol % e.g. even 90 vol % of a solid state material such as a conductive polymer. Preferably the functional materials to be deposited are of a high viscosity, e.g. higher than 50 Pa·s to even as much as about 1000 Pa·s ($10^6$ cp.$). Provided that shear forces can be avoided during the transfer process, such highly viscous materials will not significantly deform due to gravity and flow, but substantial maintain the intended aspect ratio and form definition in the transfer.

In US20170268100 a transfer method is described, known as photonic printing, using a transparent transfer plate having cavities formed therein, that are filled with a functional material. The transfer plate is irradiated with pulsed light to heat a layer of light-absorbing material in order to generate gas at an interface between the layer of light absorbing material and the functional material, to release the functional material from the cavities. The problem with this method is a non-uniform release of ink due to shadow effects. Especially for high aspect ratio cavities that are closely packed, the light only reaches the sides with difficulty. A non-uniform release of the ink results in poor print qualities, in particular when high resolution patterns are transferred over relatively large distances. Furthermore, to properly transfer feature sizes of 5-10 µm without overheating the ink, the heat flux needs to be at least 40 kW/cm² in the order of microseconds, which are unrealistic operation conditions for flashlamps. An other problem is that the method is only suitable for global transfer of structures designed via the patterned cavities provided in the substrate, as the light is not selective. Ideally patterns can be selectively formed and transferred, depending on a required pattern.

Other means are available to provide a heatflux of such magnitudes in a short during pulse. For example, this can be achieved with a laser beam. Generally, a cavity may have dimensions which exceed the dimensions of the spot covered by the laser beam, which necessitates a scanning movement of the laser beam to achieve a transfer of the material over the full length of the cavity.

European patent application EP20171361.7 (P124616EP00), which is not published yet, and filed by the same applicant specifies a method using resistive heating. Therein a resistive heating device in thermal contact with the cavity is provided. The resistive heating device is to heat a functional material in the cavity, having a material composition that, when heated by the heating device, generates a gas at an interface between said cavity surface in the cavity and the functional material. A pressure of the generated gas causes a transfer of the functional material from the cavity onto the receiving substrate.

In case the feature to be deposited on the receiving substrate is relatively large, e.g. in the case of a conducting line to be deposited, it may be complicated to properly control the transfer process. In practice it may not be possible to avoid shear forces, for example due to spatial variations in the heat flux into the functional material. As a result, in the process of transferring, even highly viscous functional materials tend to deform, so that the morphology of the elements formed of the functional material tends to differ from the morphology of the functional material in the cavity in the transfer plate. This deformation could be minimized by reducing the printing gap. However, in many industrial applications, the target substrate on which the functional material is to be deposited often shows substantial height variations, for example due to components mounted on the target. In that case elements deposited on zones of the target surface more remote from the transfer plate surface would be subject to a larger deformation than elements which are closer to the transfer plate surface. To mitigate the effects of these variations on the morphology of the printed elements, industrial application typically require a large printing gap. However, in that case, variations occurring at the time of ejection of the functional material, e.g. due to shear forces are strongly magnified.

Accordingly, there is a need for measures that enable a better of control of the deposition process.

SUMMARY

According to a first aspect of the present disclosure a transfer method is provided as claimed in claim 1. The method as claimed therein comprises the following steps:

providing a plate having a donor surface that includes at least one donor area;

providing a plurality of individually addressable resistive heater elements in thermal contact with respective zones of the at least one donor area;

providing viscous functional material (also denoted as donor material) in the at least one donor area, having a material composition that, when sufficiently heated, generates a gas at an interface between said donor surface in the donor area and said functional material, to transfer said functional material from said at least one donor area by said gas generation onto the receiving substrate;

heating respective portions of said viscous functional material in respective zones of the at least one donor area by supplying respective ones of said plurality of individually addressable heater elements with an electric power having a respective time dependent magnitude.

The claimed method renders it possible to better control a heat distribution as well as a distribution of forces exerted on the functional material over the range of the donor area as a function of time. Therewith the process of transferring functional material can be better adapted to the morphology of the target surface.

In some embodiments the donor area is at level with the surrounding surface. This is advantageous in that patterning of the plate is obviated. A printing method, such as screen printing can be used to deposit the functional material according to a desired pattern onto the donor surface. In other embodiments the at least one donor area is formed as a cavity in the donor surface. A higher spatial accuracy can be achieved when the functional material to be deposited is confined in a cavity. In exemplary embodiments a cavity forming a donor area is 1-1000 micron deep and has a smallest diameter ranging between 1 and 5000 micron. The functional material can be provided in the cavity for example using a doctor's blade. In the remainder of the description it will be presumed that the donor area comprising the functional material is formed as a cavity in the donor surface. The present disclosure however equally applies to methods and devices wherein the functional material is provided in a donor area at level with the surrounding surface. Furthermore embodiments may be contemplated wherein some of the donor areas are formed as a cavity and other donor areas are at level with the surrounding surface.

In an embodiment said heating is performed in a plurality of heating cycles, wherein during mutually different phases within a heating cycle a respective one of at least a subset of the plurality of individually addressable heater elements is provided with an electric power, wherein the electric energy provided within a single phase is below a threshold value at which a transfer of the functional material occurs, and the total amount of electric energy provided in said plurality of heating cycles exceeds said threshold value. Accordingly, the plurality of heating cycles comprise initial heating cycles wherein the functional material is gradually heated while avoiding that generated gas causes a transfer of functional material and a final heating cycle wherein sufficient gas is generated to actually transfer the material. In this embodiment an adherence of the functional material in the at least one cavity is minimized during the initial heating cycles. Therewith shear forces exerted on the functional material in the final heating cycle are reduced to a minimum. Therewith the functional material in the at least one cavity can be deposited with minimal morphological changes even at a large distance.

In other embodiments the improved method is used to deliberately adapt the morphology of the functional material to that of the target surface. In some of these other embodiments the plurality of individually addressable heater elements are arranged in successive length zones of an elongate cavity and heating is performed by subsequently supplying electric power to a respective one of the plurality of individually addressable heater elements, wherein a non-linear relationship exists between a rank of the individually addressable heater elements in said succession and a point in time at which a supply of electric power is initiated thereto. In one example thereof the improved method is used to transfer functional material from the at least one cavity at an end portion of a receiving substrate having an upper target surface, a side target surface and a lower target surface. In this exemplary embodiment of the improved method the cavity includes at least a first length zone, a one but last length zone and a last length zone, wherein heating the last length zone is postponed with a delay period after said heating the one—but last length zone. In a first phase the material from the first length zone is transferred and adheres to the upper target surface. In one or more subsequent phases functional material is ejected from one or more subsequent zones, including the one but last length zone. After these one or more subsequent phases the strip of functional material is attached at one end to the upper target surface and at the opposite end it is still contained in the last length zone of the at least one cavity. The delay period serves as a relaxation time wherein vibrations of the strip of functional material are allowed to dampen out. If these vibrations are sufficiently dampened, the last length zone is heated to eject the strip of functional material at that location. As a result, the strip of functional material folds around the side target surface and the portion originating from the last length zone adheres to the lower target surface. In this exemplary embodiment, the postponement of heating avoids that the strip of functional material hits the side target surface with an excessive velocity, and therewith mitigates the risk that the strip is broken into pieces.

In an embodiment of the method the plate and the receiving substrate are moved relative to each other while in the process of transferring functional material from the at least one cavity, a first portion thereof already adheres to the receiving substrate while another portion thereof still adheres to the plate surface in the cavity. This embodiment provides for various additional processing options. For example, a strip of functional material that is transferred from the cavity to the receiving substrate can be stretched so that a resulting deposited conductor is longer and thinner than the original strip. This implies that for long thin lines, the release of the functional material should be slower than the relative movement of the substrate. As an other example, this embodiment renders it possible to deposit an electrically conductive line that bridges a recession in the substrate surface. I.e. therewith it is avoided that the material of functional material enters the recession.

According to a second aspect of the present disclosure, transfer device is provided for transferring of a viscous functional material, onto a receiving substrate. The transfer device comprises:

a plate having a donor surface that includes at least one donor area with said functional material, said functional material having a material composition that, when sufficiently heated, generates a gas at an interface between said donor area surface in the donor area and said functional material, to transfer said functional material from said at least one donor area by said gas generation onto the receiving substrate;
a plurality of individually addressable resistive heater elements in thermal contact with a respective zone of the at least one donor area,
control circuitry configured to supply an electric power having a respective time dependent magnitude to respective ones of said plurality of individually addressable resistive heater elements.

As noted above, a donor area may be at level with the surrounding surface or may be formed as a cavity in the donor surface. Also in some embodiments a plate is provided with one or more donor areas at level with the surrounding surface and other donor areas formed as a cavity.

BRIEF DESCRIPTION OF THE DRAWINGS

These and other aspects are described in more detail with reference to the drawing. Therein:
FIG. 3 schematically shows a second embodiment of the improved transfer method;
FIG. 4A-4H shows individual steps of the second embodiment of FIG. 3 in more detail;
FIG. 8A-8E shows individual steps of the fifth embodiment of the improved transfer method.

DETAILED DESCRIPTION OF EMBODIMENTS

Like reference symbols in the various drawings indicate like elements unless otherwise indicated.

Figure 1:
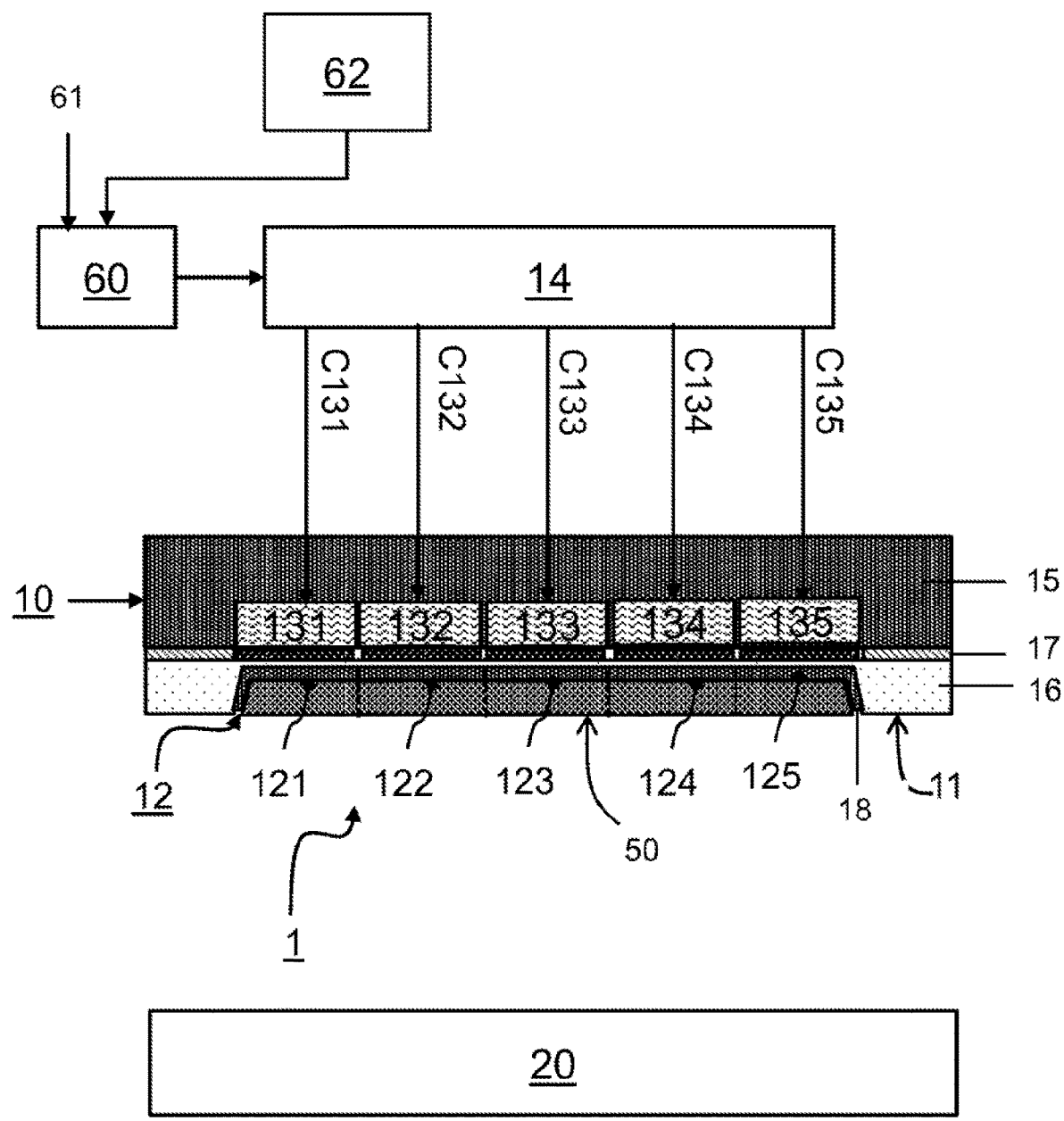
FIG. 1 schematically shows an embodiment of the improved transfer device.

FIG. 1 schematically shows a transfer device 1 for transferring of a viscous functional material 50, e.g. an electrically conducting material, onto a receiving substrate 20, such as a circuit board having electronic components to be electrically interconnected. The transfer device 1 comprises a plate 10 that has a cavity surface 11 with at least one cavity 12 filled with the functional material 50 to be transferred. The functional material 50 has a material composition that, when sufficiently heated, generates a gas at an interface between the cavity surface 11 and the functional material 50. The resulting gas pressure therewith causes a transfer of the functional material 50 from the cavity 12 onto the receiving substrate 20. In the embodiment shown, the plate 10 comprises a carrier layer 15 and a cover layer 16 of which the latter has a low thermal conductivity to restrict a heat flow to the surface 11 outside the range of the (at least one) cavity 12 and an encapsulation layer 17 of an electrically insulating material. The transfer device 1 comprises a plurality of individually addressable resistive heater elements 131, 132, 133, 134, 135 that are in thermal contact with a respective zone 121, 122, 123, 124, 125 of the cavity 12. The resistive heating elements are accommodated electrically insulated from each other in the encapsulation layer 17 between the carrier layer 15 and the cover layer 16, For illustration purposes the size of the heating elements as indicated in the drawings is exaggerated, so that they seem to protrude the carrier layer 15. FIG. 1 further shows that the surface 11 inside the cavity 12 is coated with a high thermally conductive heat spreader 18 to evenly distribute the heat flux around the functional material, for a more uniform ink release and reducing shear forces. The range within which the heat is spread can be controlled by a proper selection of the thickness of the heat spreader, so that on the one hand a good uniformity is achieved while still being capable to control the distribution of the heat flux at the granularity of the resistive heating elements.

In the example shown in FIG. 1 the cavity 12 has an elongate form, and the zones 121, 122, 123, 124, 125 are subsequent length zones therein.

The individually addressable resistive heater elements 131, 132, 133, 134, 135 are coupled to a control circuitry 14. The control circuitry 14 is configured to supply an electric power C131, C132, C133, C134, C135 having a respective time dependent magnitude to respective ones 131, 132, 133, 134, 135 of the plurality of individually addressable resistive heater elements.

Figure 1A:
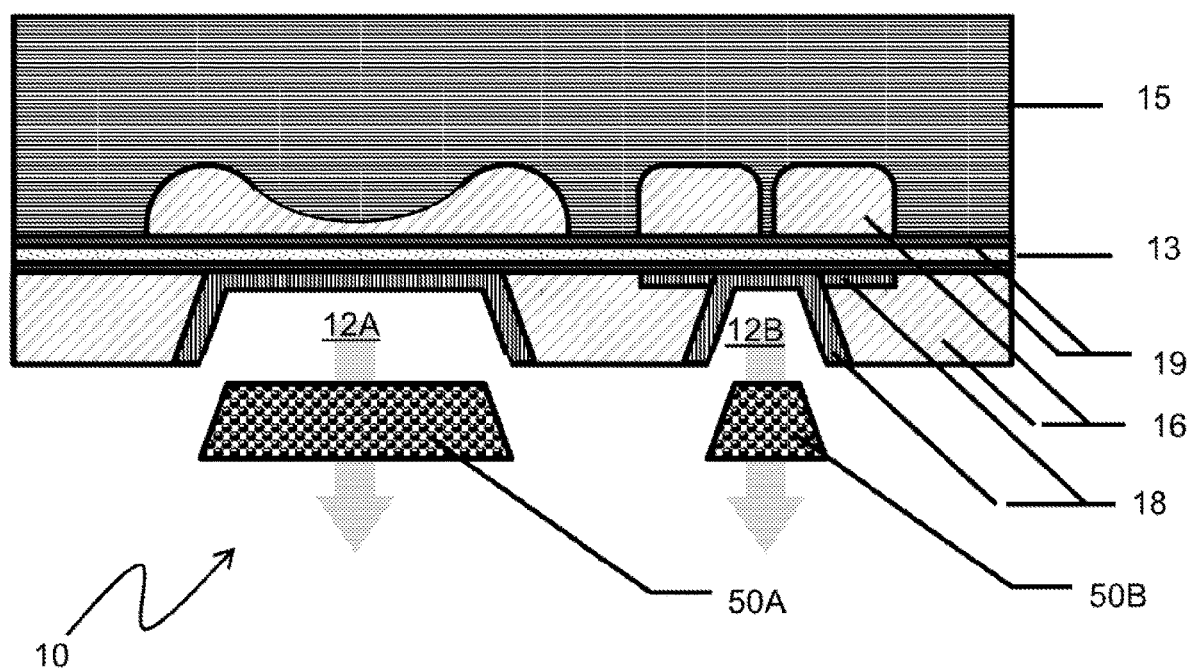
FIG. 1A shows in more detail elements of an improved transfer device.

Some elements are shown in more detail in FIG. 1A, which shows a portion of a plate 10 comprising an individually addressable heating element 13 which is in thermal contact with a first and a second cavity 12A, 12B, each provided to transfer a respective portion 50A, 50B of functional material.

In some embodiments the device may have a predetermined configuration to operate in a predetermined manner.

In the embodiment shown, the control circuitry 14 is configured to read a record carrier 60 that comprises instructions that specify the time dependent magnitude according to which it is to supply power to the respective resistive heater elements 131-135. Mutually different record carriers may specify mutually different embodiments of methods to be performed with the device 1. Examples thereof are provided below. Also it may be conceived that the device has a proper record carrier, that can be loaded with instructions for each case, for example instructions received from the internet 61, or provided by an operator via a user interface 62.

The substrate 20 may be of a rigid or of a flexible nature. The term "flexible substrate" used in this text refers in particular to a substrate that is bendable enough to be used in a reel to reel process. In other words a flexible substrate as used in this text is a substrate that is flexible enough to allow bending over a certain curvature, e.g. with a radius of 1-100 centimeters (depending on the reel diameter), without the substrate losing essential functionality. Supply of chip bonding material matter 50 can e.g. be placed on a pad structure or on chip pads.

The functional material to be transferred is for example, a thermosettable isotropic conductive adhesive material with a volume resistivity of typically 400-1000 microOhm·cm. To illustrate the general applicability of the method, an experimental conductive adhesive is transferred consisting of a highly viscous conductive adhesive with a viscosity of 160-180 Pa·s. The conductive adhesive can be provided as homogenous layer of 20-30 micron, in particular, 25 micron thick. The thickness is controlled to be around 25 µm or 50 µm but could be theoretically be of any thickness. For example, a cavity 12 may be in the order of 5-10 micron deep and may have a smallest diameter of less than 50 micron.

Figure 2:
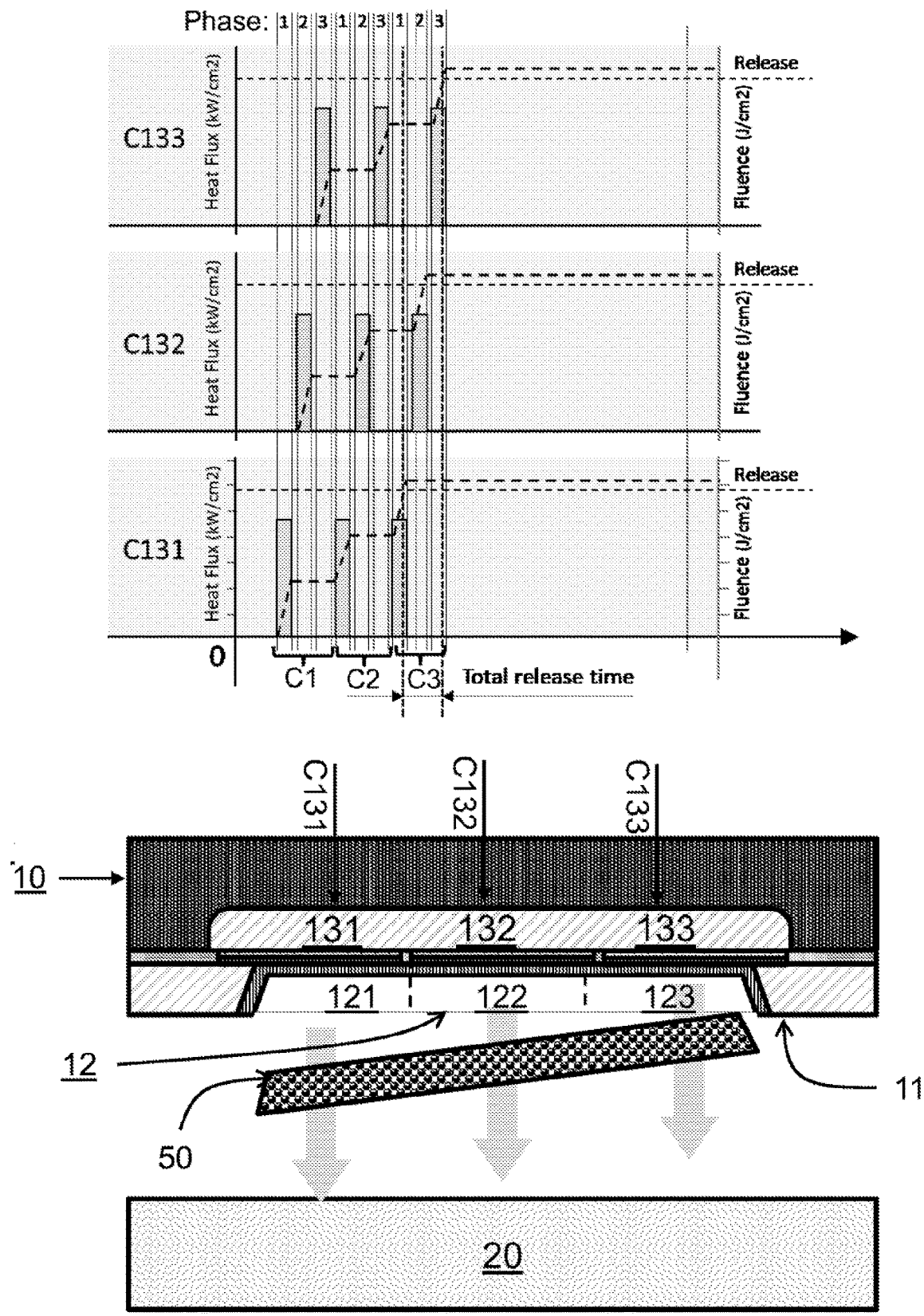
FIG. 2 schematically shows a first embodiment of the improved transfer method.

FIG. 2 schematically shows a method of operating the transfer device 1. The lower part of FIG. 2 shows a plate 10 that is substantially similar to the one described with reference to FIG. 1 apart from the fact that in this case the cavity 12 comprises three length zones 121, 122, 123. As in the example of FIG. 5, the length zones 121, 122, 123 are in thermal contact with a proper individually addressable resistive heater element 131, 132, 133. A viscous functional material 50 to be deposited on the substrate 20 was provided in the cavity 12, for example using a doctors blade.

The upper part of FIG. 2 shows how the individually addressable heater elements 131, 132, 133 each are provided with an electric power C131, C132, C133 having a respective time dependent magnitude. In the example shown, heating is performed in a plurality of heating cycles, in this case three heating cycles C1, C2, C3. During mutually different phases within each heating cycle each time one of the individually addressable heater elements 131, 132, 133 is provided with an electric power. As indicated by the thick dashed curves, the electric energy (fluence) provided within a single phase is below a threshold value (Release) at which a transfer of the functional material would occur. However, the total amount of electric energy provided in the three heating cycles exceeds the required threshold value. In the example shown, in each cycle electric energy is provided to the heater element 131 in the first phase, to the heater element 132 in the second phase and to the heater element 133 in the third phase. In the third heating cycle C3, the accumulated electric energy exceeds the release threshold in the first length zone 121 during the first phase, in the second length zone 122 during the second phase and in the third length zone during the third phase. Because the accumulated energy at the start of the third cycle C3 is already close to the release threshold, each zone of the cavity 12 only needs to be heated for a short time. Therewith the mutual differences in the release time of the portions of the functional material is small as compared to the case wherein the portions are heated in a single heating cycle. By reducing the differences in release time deformations of the functional material during the process of transfer are minimized.

As shown in FIG. 3 and FIG. 4A-4H, the improved deposition apparatus further renders it possible to deliberately deform the functional material 50 during its deposition in a controlled manner in order adapt the shape of the functional material to the shape of the surface of the substrate 20 where it is to be deposited. In this example the substrate surface comprises an upper surface 21, a side surface 22 and a lower surface 23, and the functional material 50 to be deposited is to be wrapped around an end of the substrate 20, so that it extends over an end portion of the upper surface 21 over the side surface 22 and over an end portion of the lower surface 23, for example to electrically connect an elements on the upper surface 21 with an element on the lower surface 23.

As shown in FIG. 3 and FIG. 4A-4G this is achieved in that the plurality of individually addressable heater elements 131, 132, 133, 134, 135 are arranged in successive length zones of the elongate cavity 12 filled with the viscous functional material 50 to be deposited at time T0 (See FIG. 4A). Heating is performed by subsequently supplying electric power to a respective one of the heater elements, wherein a non-linear relationship exists between a rank of the individually addressable heater elements in succession and a point in time at which a supply of electric power is initiated thereto. In the upper part of FIG. 3 this is illustrated in that during a first time interval T1, power C131 is supplied to a first heater element 131 to heat a first length zone of the cavity 12 (See FIG. 4B). As shown in FIGS. 4C, 4D and 4E, during subsequent time intervals T2-T4 that succeed each other without a significant interruption, power C132-C134 is supplied to the subsequent heater elements 132-134 to heat subsequent length zones of the cavity 12. Then, as shown in FIG. 4F, further supply of power is postponed during a time interval T45 before power C135 is supplied to the fifth heater element 135 during a fifth time interval T5, as shown in FIG. 4G. As schematically shown in the lower part of FIG. 3 and in FIG. 4F, subsequent to the heating step in T4, the strip of functional material 50 is adhered at one end to the upper surface of the receiving substrate 20 and at the other end it is still adhered to the surface 11 of the plate inside the cavity 12. The time interval T45, serves as a relaxation time wherein vibrations of the strip of functional material 50 are allowed to dampen out. If these vibrations are sufficiently dampened, the last length zone is heated to eject the strip of functional material at that location. As a result, at time T6, shown in FIG. 4H, the strip of functional material 50 folds around the side target surface 22 of the receiving substrate 20 and the portion originating from the last length zone adheres to the lower target surface 23. The postponement of heating during the time interval T45 avoids that the strip of functional material 50 hits the side target surface 23 with an excessive velocity, and therewith mitigates the risk that the strip is broken into pieces.

Figure 5:
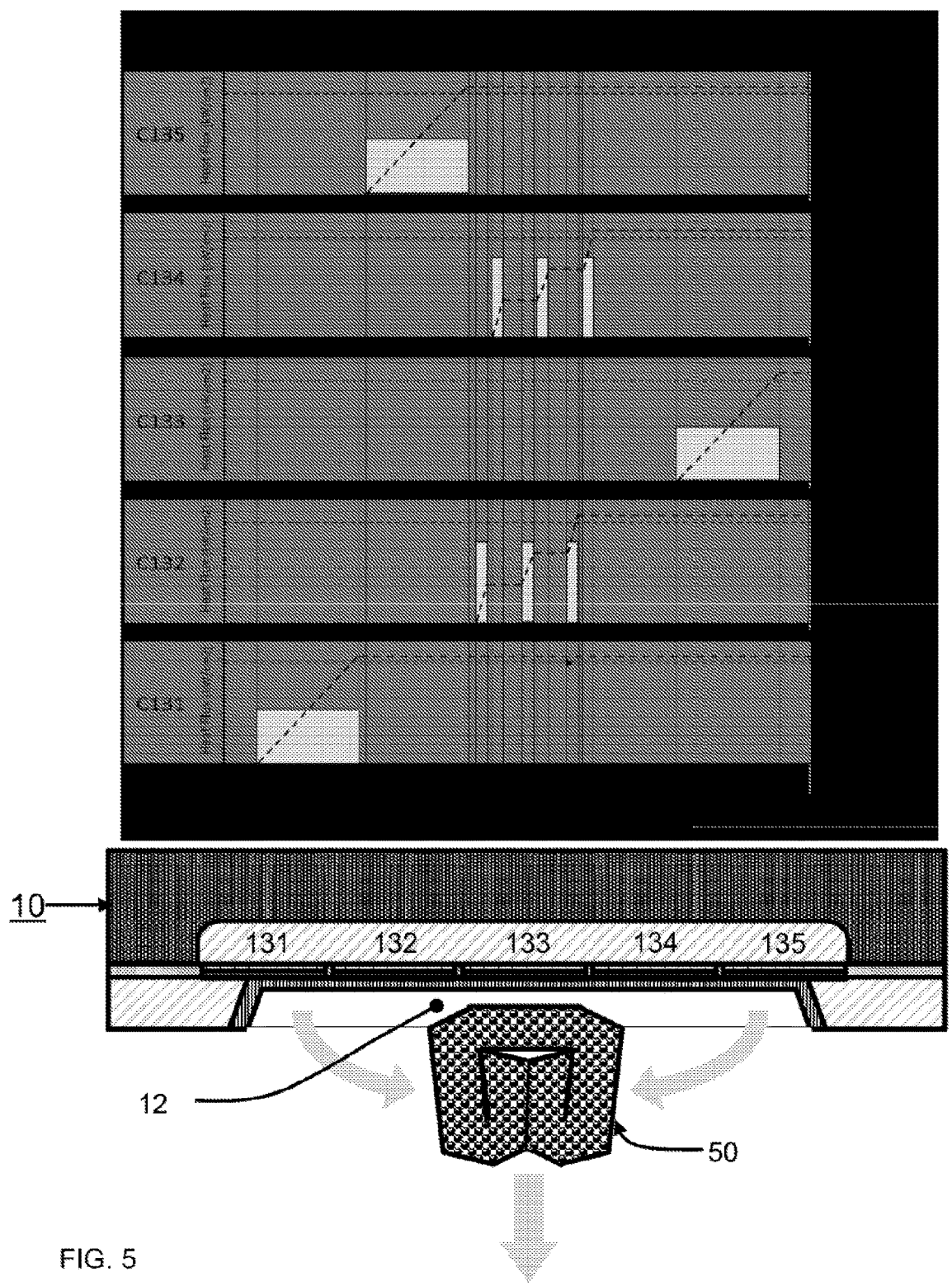
FIG. 5 shows a third embodiment of the improved transfer method.

FIG. 5 and FIG. 6A-6F show a further embodiment of the method, wherein different heating modes are combined to fold a strip of functional material 50 during its deposition on the receiving substrate 20, so that it forms an element 51 of the functional material that has a height exceeding that of the depth of the cavity from which it was transferred. The upper part of FIG. 5 shows the power signal C131, . . . , C135 for each of the heater elements 131, . . . , 135, i.e. the power as a function of time supplied thereto.

Figure 6:
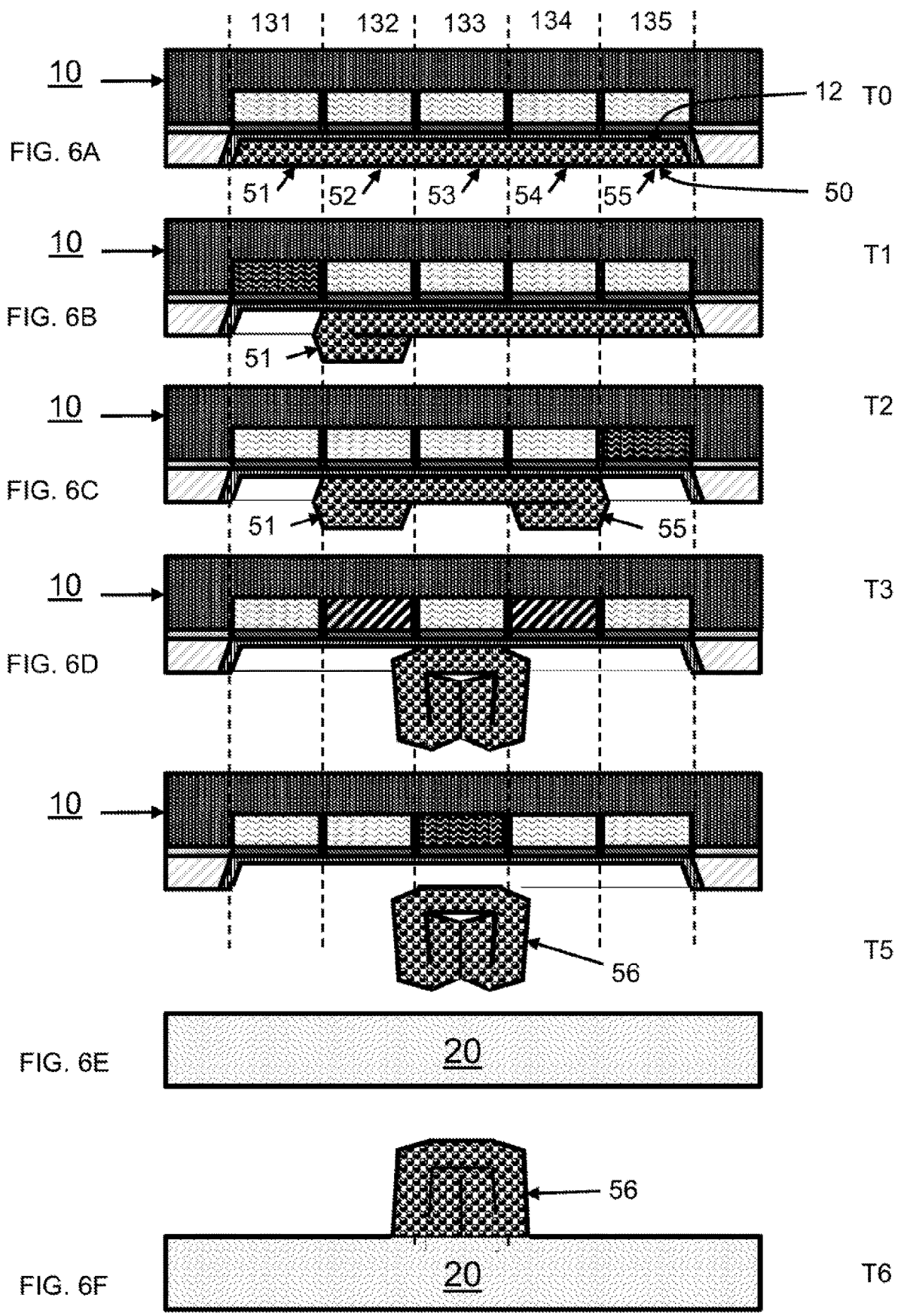
FIG. 6A-6F shows individual steps of the third embodiment of FIG. 5 in more detail.

As shown in FIG. 6A, at T0, the plate 10 is provided having its cavity filled with the strip of viscous functional material 50. During the subsequent time intervals T1, T2 (See FIG. 6B, 6C respectively) the heater elements 131, 135 at the mutually opposite ends of the cavity are powered with C131, C135 respectively. The amount of energy supplied therewith is sufficient to generate a gas pressure at an interface between the cavity surface in the cavity and the functional material, to force the functional material from the corresponding end-portions of the cavity. Because the functional material 50 has a center portion 52, 53, 54 that is still adhered to the cavity surface, the end portions 51, 55 of the viscous functional material 50 respectively fold over the centrally arranged portions 52, 54 respectively.

As further shown in FIG. 6D, during the next time interval T3, heating of the heater elements 132 and 134 is performed in three heating cycles C1, C2, C3. During a first phase and a second phase within each heating cycle heater element 132, 134 is provided with an electric power C132, C134. The electric energy provided within a single phase is below the threshold value at which the functional material portions 52, 54 are driven out of the cavity, so that these functional material portions are heated in a substantially symmetric manner. During the last heating cycle the amount of energy supplied to these portions exceeds the threshold value so that they are forced to fold inwards. Because only a modest amount of energy needs to be supplied in this last heating cycle, the duration of each phase therein can be short, so that the ejection of the portion 54 can rapidly follow the ejection of portion 52, therewith providing for a substantially symmetric fold. Finally, as shown in FIG. 6E, during time interval T5, the most central portion 53 is heated with heater element 133, so that the folded strip 56 of functional material is transferred towards the receiving substrate 20, and adheres thereto at T6 as sown in FIG. 6F. It is noted that during a time interval T4, heating is interrupted, to allow a completion of the folding of the material portions 52, 54.

Figure 7:
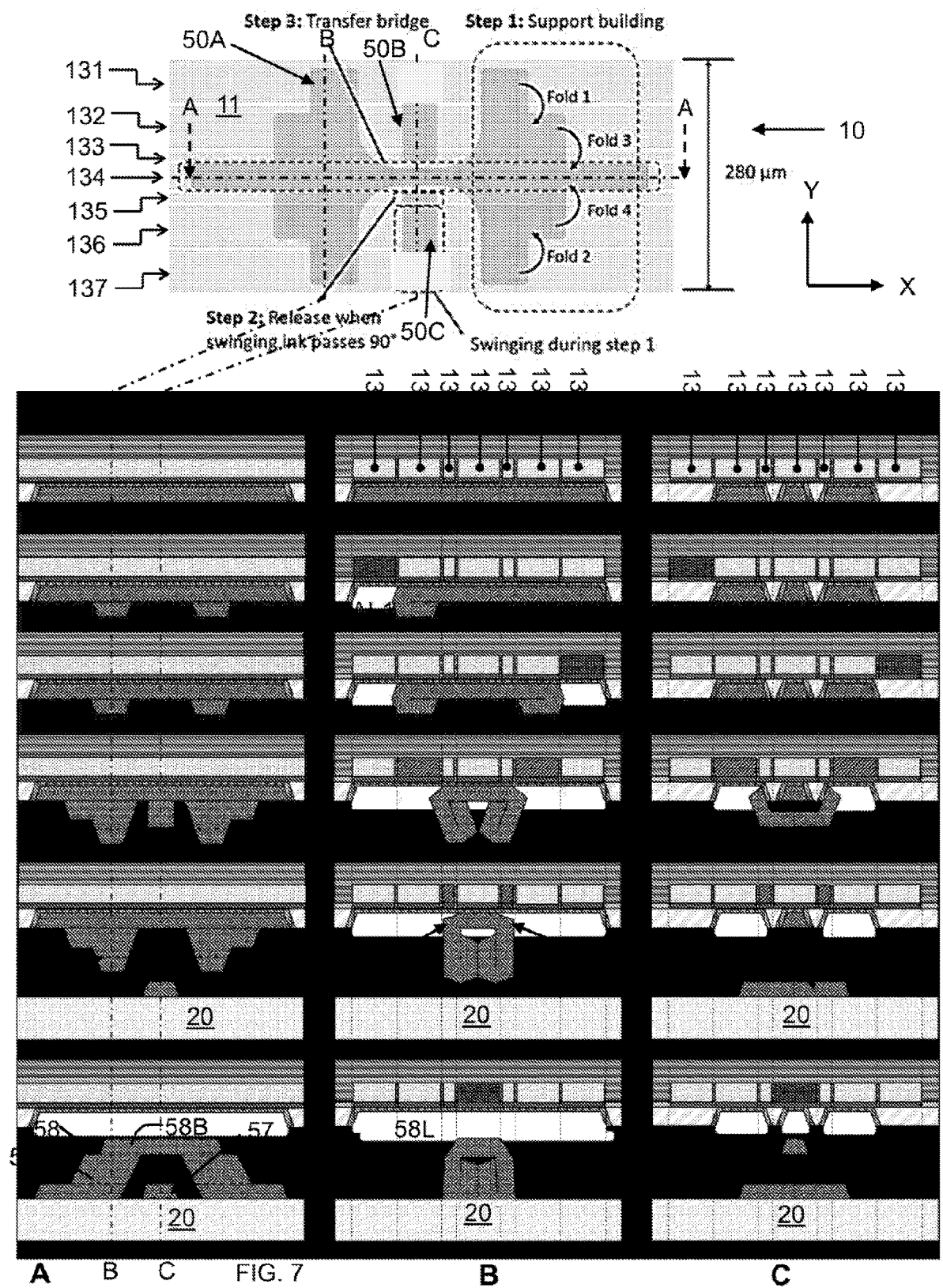
FIG. 7 shows a fourth embodiment of the improved transfer method.

FIG. 7 shows an example how even more complex constructions can be formed on a substrate surface. The upper part of FIG. 7 shows the surface 11 of the plate 10 that is provided with mutually separate functional material sections 50A, 50B, 50C in respective cavities. The plate 10 has subsequent resistive heater elements 131, 132, 133, 134, 135, 136, 137 having a length in the direction X. Each heater element is configured to heat a region in a proper range in the direction Y. FIG. 7 further shows on the lower left a series of cross-sections A according to A-A as indicated in the upper part, and in the lower-middle and the lower right respectively a series of cross-sections B, C according to B-B and C-C as indicated in the cross-section A. These series of cross-sections are also indicated as A and B in the upper part of FIG. 7.

The upper one of each series of cross-sections A,B,C indicates the plate 10 as it is initially provided at T0.

During a time interval T1, the resistive heater element 131 is heated. As a result, the portions of the material section 50A present in this range, denoted as AL1 on the left and AR2 on the right are heated to an extent that they are forced out by the vapor pressure locally created in the cavity. As a result, these portions fold inward (Fold 1) similarly as the portion 51 in FIG. 6B. Similarly, during a time interval T2, the resistive heater element 137 is heated. As a result, also the portions AL7, AR7 of the material section 50A present in this range are heated to an extent that they are forced out by the vapor pressure locally created in the cavity and fold inwards (Fold 2).

Analogously to what was described with reference to FIG. 6D, during the next time interval T3, heating of the heater elements 132 and 136 is performed in three heating cycles. During a first phase and a second phase within each heating cycle heater element 132, 136 is provided with an electric power. Therewith the portions AL2, AL6, AR2, AR6 of the material section 50A present in the areas that in thermal contact with these heater elements are heated. Also the portions B2, C6 of the material sections 50B and 50C in these areas are heated. The electric energy provided within a single phase is below the threshold value at which locally present functional material portions are driven out of the cavity, so that these functional material portions are heated in a substantially symmetric manner. During the last heating cycle the amount of energy supplied to these portions exceeds the threshold value. Therewith the portion AL2 carrying the earlier folded portion AL1 thereon is folded inwards (Fold 3). Likewise portion AL6 carrying AL7 folds inwards (fold 6). And similarly this applies to AR2 carrying AR1 and to AR6 carrying AR7. Also the portions B2 and C6 fold inwards and therewith fuse at the ends with which they contact each other.

During T4, heating of the heater elements 133 and 135 is performed in three heating cycles. This has as a result that in the last cycle of T4, the material of section 50B present in the range of resistive heater element 133, as well as the material of section 50C present in the range of resistive heater element 135 is ejected. Therewith the fused functional material originating from sections 50B and 50C is deposited as a single conducting strip 57 on the substrate. Also the portions, e.g. AL3, AL6 of material section 50 within the range of heater elements 133 and 135 are forced outwards, but because material section 50A is still adhered to the plate surface in the region of heater element 134, this has as the effect that the structure of material section is folded further, so that the original portions AL1 AL7 fuse with each other. Likewise portions AR1, AR7 fuse with each other. Therewith a bridge 58 is formed that has a first leg 58L formed by portions AL1 AL2, AL3, AL5, AL6 and AL7 at one side, a second leg 58R formed by portions AR1, AR2, AR3, AR5, AR6 and AR7 at the opposite side and a bridge body 58B formed by a portion A4 of the material section in the range of heater element 134. Because this heater element 134 was not yet activated, the bridge 58 is still suspended with the bridge body to the surface 11 of the plate 10.

Finally during T5 heater element 134 is heated so that the bridge 58 which was folded in the previous steps is now transferred towards the substrate 20, where it lands at its first and second leg 58L, 58R and with the bridge body 58B traverses the conducting strip 57 at distance.

A further exemplary application is shown in FIG. 8A-8E. In this example the improved method is applied to provide an electric connection to an electric terminal 26 of a component 25 on the receiving substrate 20. FIG. 8A shows the initial situation at T0. In FIG. 8B it is shown how during a time-interval T1 a central portion of the functional material 50 is released from the cavity by activating resistive heater element 133. As shown in FIG. 8C, during a subsequent time-interval T2 portions of the functional material 50 neighboring this central portion are released by pulse-wise activating the resistive heater elements 132, 134. Therewith the elements 132, 134 the electric energy provided within a single pulse is below a threshold value at which a transfer of the functional material occurs, but the total amount of electric energy provided in the sequence of pulse provided during the time-interval T2 exceeds the threshold value. Likewise, as shown in FIG. 8D, during the time-interval T3, end portions of the functional material 50 are released by pulse-wise activating the resistive heater elements 131, 135. FIG. 8E shows that as a result at T4, a strip of deposited functional material 50 forms an electric connection with the electric terminal 26 of the component 25.

Figure 9A:
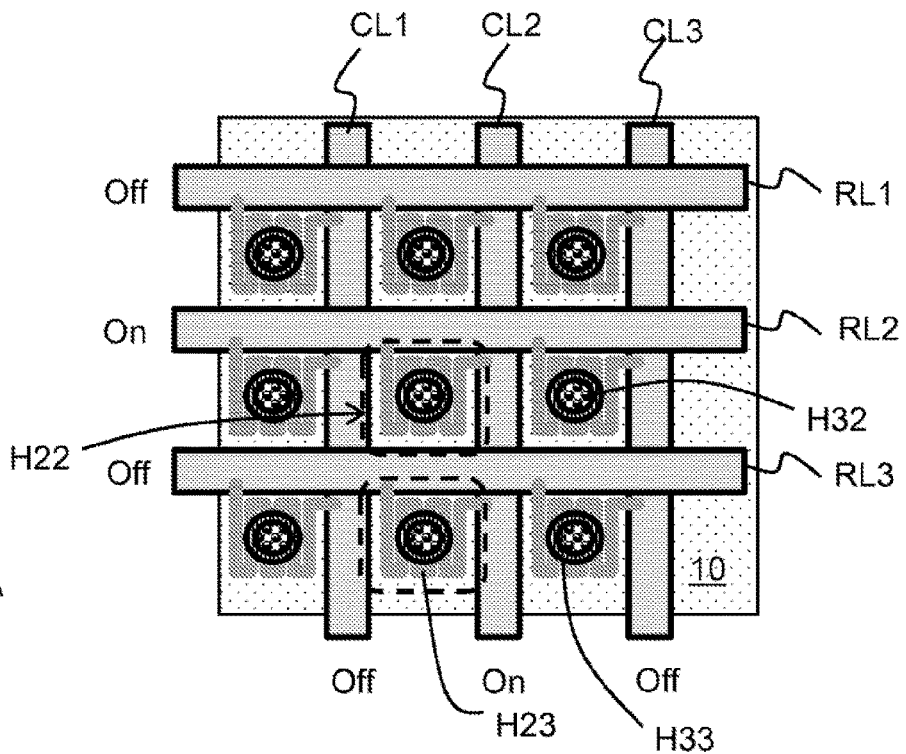
FIG. 9A-9C presents examples of resistive heater elements in an embodiment of the transfer device.

In the previous examples it was presumed that the resistive heater elements were provided each with separate contacts. FIG. 9A shows another example, wherein the resistive heater elements of the plate 10 are arranged in a heater matrix. For clarity other details of the plate 10 are not sown in this figure. The heater matrix comprises a first set of powerlines, denoted as column lines CL1, CL2, CL3 arranged in a first planar direction of the plate 10 and a second set of power lines, denoted as row lines RL1, RL2, RL3 that are arranged transverse to the column lines. In this example the lines are directed in mutually orthogonal direction, but in other examples another angle may be used, e.g. 60 degrees. By way of example, only 3 column lines and 3 row lines are shown. However, in practice a larger number of lines may be present, for example a few hundreds or thousands of lines. Each of the heater elements is electrically connected to a specific pair of a rowline and a column line. For example heater element H22 has one terminal connected to rowline RL2 and another terminal connected to column line CL2. Neighboring heater element H23 has one terminal connected to rowline RL3 and another terminal connected to column line CL2.

Heater elements in the matrix can be individually addressed by connecting their corresponding pair of power lines to a power source. In the example shown element H22 is addressed in that rowline RL2 and column line CL2 are connected to the power source. Nevertheless, when connecting the powerlines RL2, CL2, also a current may flow via other heater elements, for example following the path via heater element H32, line CL3, heater element H33, line RL3 and heater element H23. Although the current flowing via the neighboring heater elements is substantially slower than that via the addressed element, it may be desired to suppress these leakage currents.

Figure 9B:
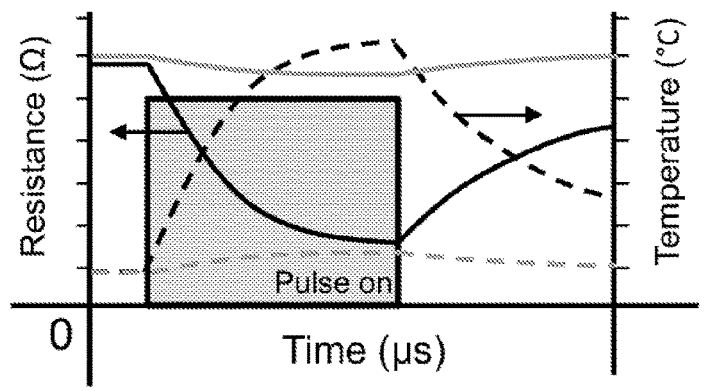

To that end, in one example the resistive heater elements are of a material with a negative temperature coefficient (NTC). The effect of this measure is shown in FIG. 9B. Therein the continuous curves and the dashed curves respectively indicate the resistance and the temperature of a heater as a function of time. For the addressed pixel the curves are black, and for the neighboring pixels the color gray is used. Due to the fact that initially the resistance of the path through the addressed heater element is lower than the resistance of the path through a sequence of serially arranged neighboring elements the temperature rises more rapidly in the addressed heater element than in the neighboring heater elements. As a result of the negative temperature coefficient therewith the resistance of the addressed heater element is reduced more than the resistance of the neighboring heater elements, so that the current path through the addressed heater element is favored more. Hence current through neighboring heater elements is suppressed.

Figure 9C:
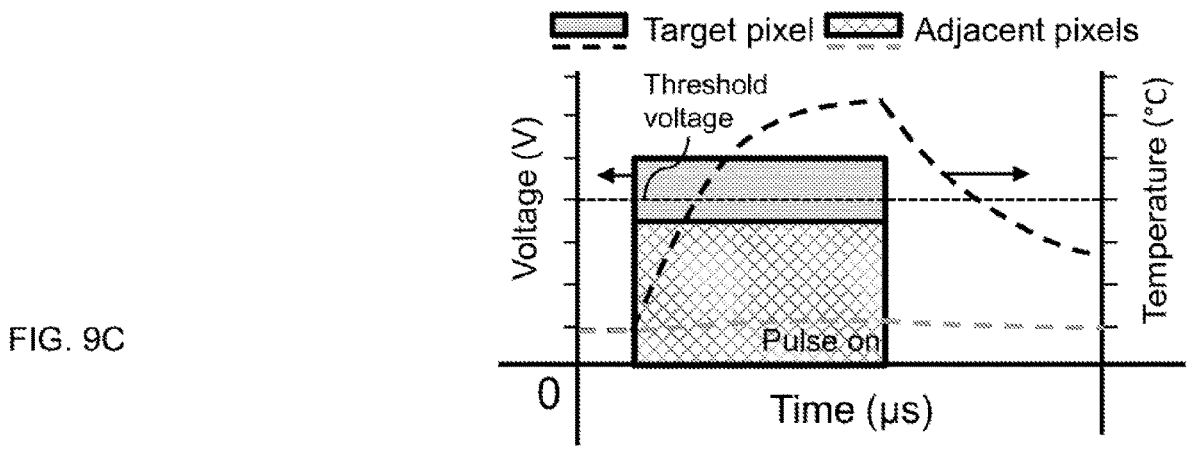

In another example, illustrated with reference to FIG. 9C, varistor heater elements are used. As in FIG. 9B, the black dashed curve indicates the temperature development as a function of time for the addressed heater element and the gray dashed curve indicates the corresponding information for neighboring heater elements. Due to the fact that the current path through the neighboring elements comprises serially arranged varistors, the supply voltage is not sufficient to render these elements conductive, so that a leakage current through these neighboring elements is suppressed.

Figure 10:
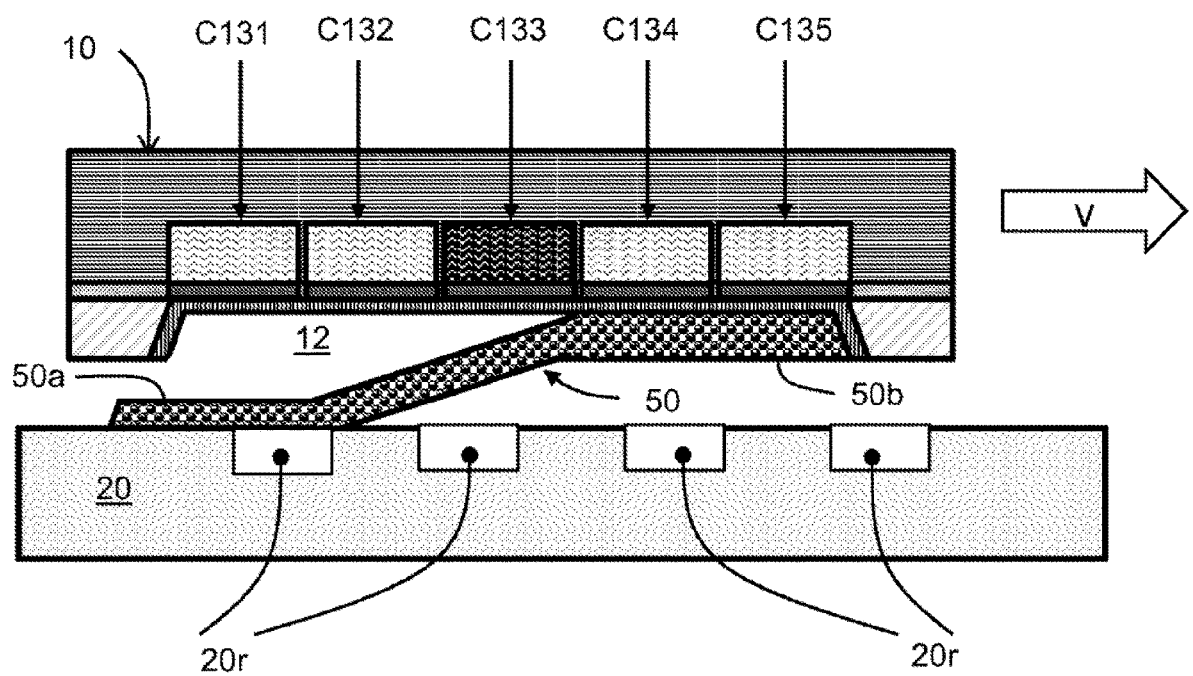
FIG. 10 shows a sixth embodiment of the improved transfer method.

FIG. 10 shows a further embodiment of the improved transfer method. Therein the plate 10 and the receiving substrate 20 are moved relative to each other during the process of transferring functional material 50 from the cavity 12. In the example shown a first portion 50a of the functional material 50 already adheres to the receiving substrate 20 while another portion 50b of the functional material still adheres to the plate surface in the cavity 12. As a result, the material 50 is stretched so that the form of the resulting deposited feature is longer and thinner than the form of the functional material in the cavity. The extent to which the material is stretched is determined by the ratio of the speed v with which the plate 10 moves relative to the substrate 20 and the speed with which the functional material 50 is expelled from the cavity in the direction of movement. The plate 10 may for example have respective individually addressable resistive heaters each extending over a range with length L in the cavity, that are subsequently heated with a mutual time delay $\tau$, corresponding to a speed of expelling the $v_e$ the functional material 50 equal to $L/\tau$. In that case the functional material is stretched with a factor $v \cdot \tau / L$.

A record carrier 60, as shown in FIG. 1 may also comprise instructions that specify the controller 14 how to control the speed v with which the plate 10 moves relative to the substrate 20 and the speed with which the functional material 50 is expelled from the cavity in the direction of movement.

As shown further in FIG. 10 this embodiment of the transfer method also enables a way of deposition wherein the deposited functional material bridges recessed features 20r.

Other variations to the disclosed embodiments can be understood and by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. Any reference signs in the claims should not be construed as limiting the scope. In addition, the functional material may have a wide-range of viscosity, possible to transfer (from 50 Pa·s to 1000 Pa·s (non-exhaustive)). Contrary to stencil printing and screen printing it is a non-contact direct write method wherein the distance to the substrate surface is preferably kept higher than 1 micron. The transfer accuracy of the functional ink is dependent on the printing gap. Typically the printing gap needs to be in the same order as the feature size to obtain a good printing accuracy. When a small printing gaps are required, it becomes technically more difficult to align the print head with the sample holder. Therefore it is preferred to control the gap by using spacer pins and press the print head and sample holder together. It is preferred to have at least three degrees (heave, roll, pitch) of freedom between the print head and sample holder. In an example pastes can be formed as follows:

| Solids content 90 ± 5 wt % | | |
| --- | --- | --- |
| Material | Solids content | Purpose |
| Metal (Ag, Cu, Au): | 86.5 ± 5 wt % | Conductivity |
| Polymer binder | 2.5 ± 2 wt % | Adhesion and cohesion |
| Fumed silica | 1 ± 1 wt % | Anti-slump, rheology control |
| Solvent: | 10 ± 5 wt % | Printability | with viscosities ranging between 100 en 1000 Pa*s. In contrast to conventional screen print paste and inks shear thinning may be minimized e.g. by adding fumed silica to prevent flow of the past on the acceptor substrate. This can also be prevented by curing/drying the ink e.g. by laser irradiation, which can be conveniently realized by a high solids content and low solvent content.

The power required to induce a gas pressure is dependent on the functional material used with the method. As a rule of thumb it may be required that the control circuitry connected to the resistive heating elements configured to heat the a heating element in less than 100 microseconds at an average power of more than 10 kW/cm2. Alternatively, it may be required that the control circuitry allows the resistive heater elements to heat the functional material at a heating rate of at least 5K/microsecond in order to generate gas at the interface to provide for the gas pressure that forces the functional material out of the cavity. In case a direct ejection is not required the heating power is provided in a sequence of cycles as shown for example in FIG. 2.

In addition to controlling the transferring process by supplying individually addressable heater elements with an electric power having a respective time dependent magnitude it is possible to control a heat flux distribution associated with an individual heat by means of its shape, as is illustrated in the following examples in FIGS. 11A, 11B and 11C.

In each of these figures, the lower part shows a cross-section through the plate 10 while functional material is being deposited. The middle part shows in a view in a direction towards the surface 11 of the plate 10, a cross-section of the individual addressable resistive heating element 13. The upper part schematically shows the local heat flux (solid line) as a function of the position along the cavity 12 and the associated release time (dashed line).

Figure 11A:
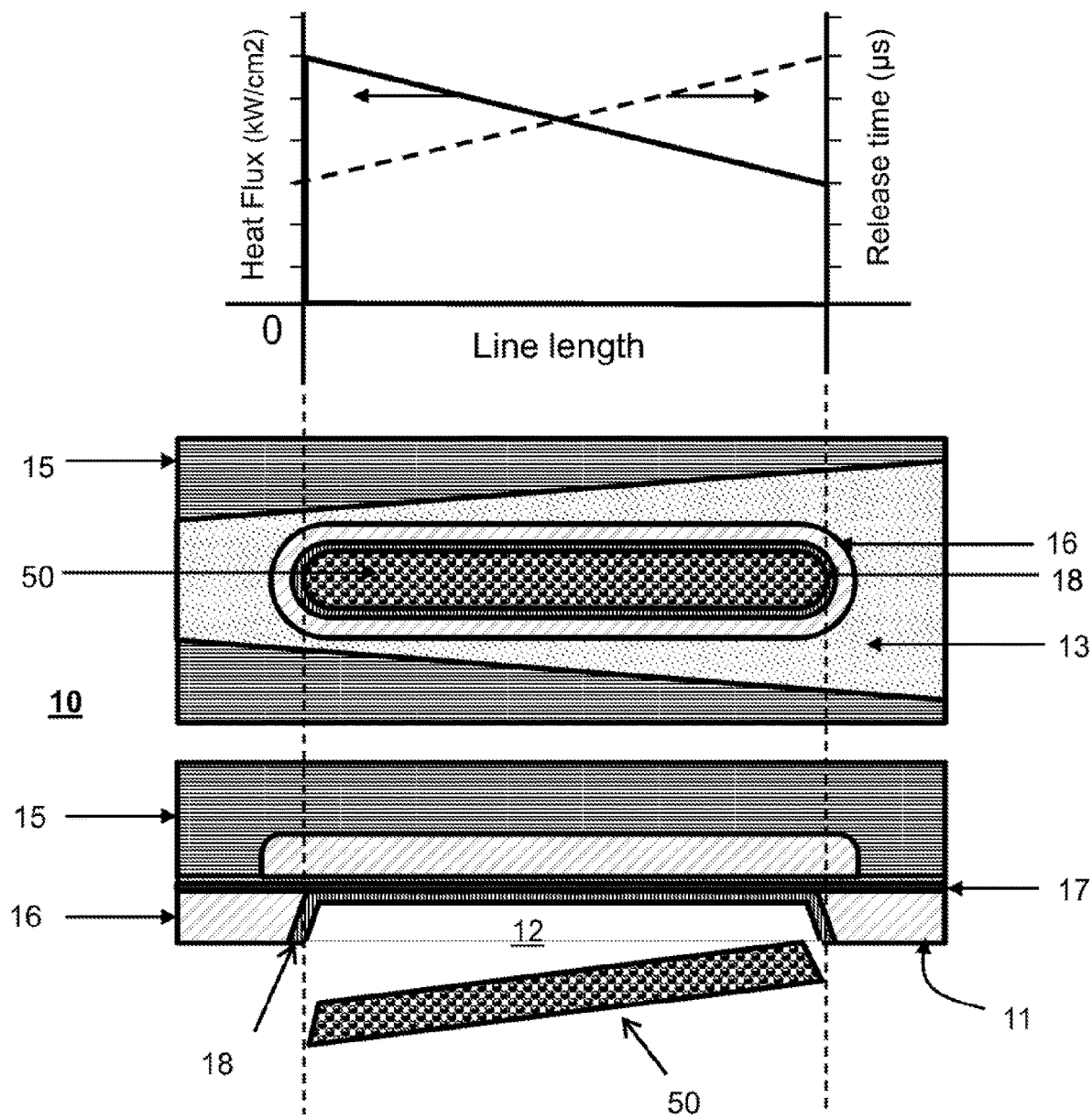
FIG. 11A, 11B, 11C shows examples of further embodiments of the improved transfer method.

In the example of FIG. 11A the cross-section of the resistive element 13 increases in a direction from left to right along the cavity 12. As a result, the resistive element has a resistance and therewith a heat flux that decreases in that direction, Consequently the release time for the material 50 in the cavity 12 is larger for positions more to the right end of the cavity. In the lower part of FIG. 11A this is illustrated in that the unit of functional material is tilted with its left end towards the substrate (not shown) where it will be deposited.

Figure 11B:
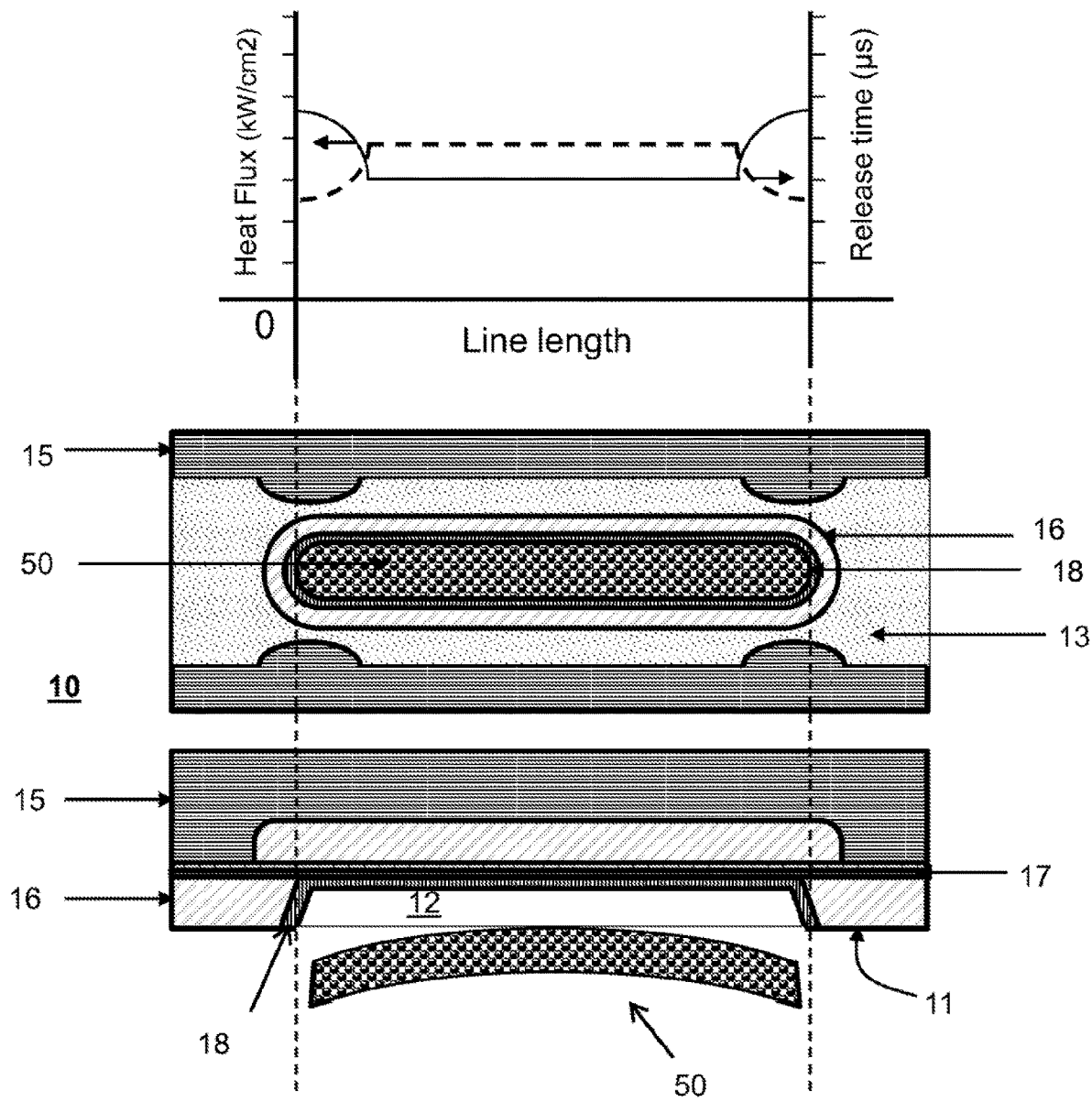

In the second example, shown in FIG. 11B, the cross-section the cross-section of the resistive element 13 is narrows at the ends of the cavity 12, and is relatively wide in a center portion. As a result, the resistive element has a relatively high resistance at the ends of the cavity as compared to in the center portion of the cavity. Therewith the resistive element provides for a relatively high heat flux at the ends of the cavity 12 as compared to the heat flux generated in between the ends, Consequently the release time for the material 50 at the ends of the cavity 12 is relatively short as compared for that of the remainder of the material 50. In the lower part of FIG. 11B this is illustrated in that the unit of functional material 50 is curved with its ends towards the substrate (not shown) where it will be deposited.

Figure 11C:
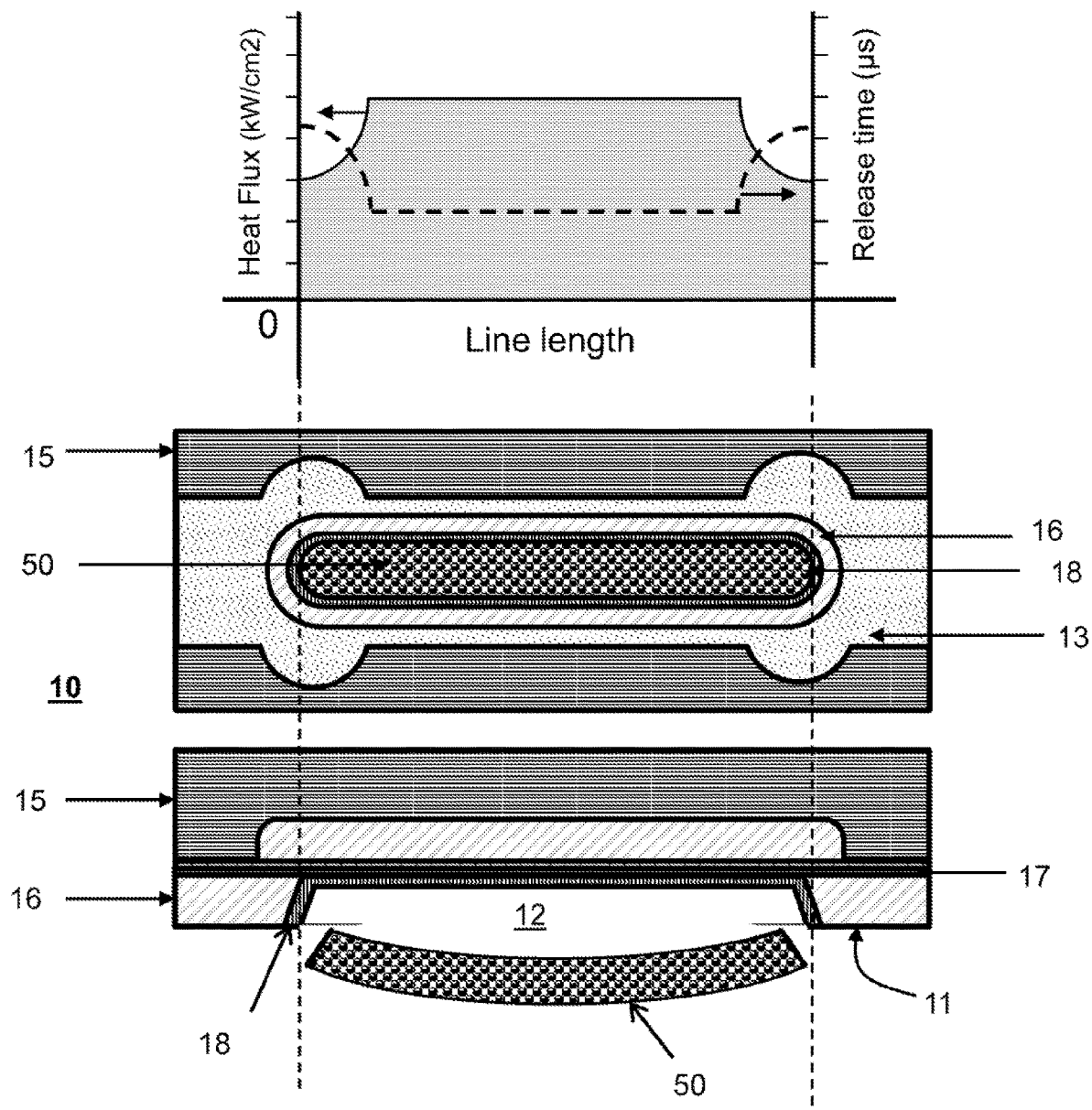

FIG. 11C shows a third example, wherein the cross-section of the resistive element 13 widens at the ends of the cavity 12, and has a relatively constant small width in a center portion. As a result, the restive element has a relatively low resistance at the ends of the cavity as compared to in the center portion of the cavity. Therewith the resistive element provides for a relatively low heat flux at the ends of the cavity 12 as compared to the heat flux generated in between the ends, Consequently the release time for the material 50 at the ends of the cavity 12 is relatively long as compared for that of the remainder of the material 50. In the lower part of FIG. 11B this is illustrated in that the unit of functional material 50 is curved with its ends towards the plate 10.

While the present invention has been described with respect to a limited number of embodiments, those skilled in the art will appreciate numerous modifications and variations therefrom within the scope of this present invention as determined by the appended claims. For example, as noted above, a donor area may be at level with the surrounding surface or may be formed as a cavity in the donor surface. Also in some embodiments a plate is provided with one or more donor areas at level with the surrounding surface and other donor areas formed as a cavity. For example, according to a modification within the scope of the claims a plate having a donor area formed as a cavity in the donor surface may be replaced with a plate having a donor area at level with the surrounding donor surface.

The invention claimed is:

1. A transfer device for transferring of a functional material, onto a receiving substrate, the device comprising:
   a plate having a donor surface that includes at least one donor area that is formed as a cavity in the donor surface and that is filled with the functional material, the functional material being one selected from the group consisting of: an electric conductor, an electric insulator, a thermal conductor and a thermal insulator, and wherein the functional material has a viscosity of at least 50 Pa·s and a material composition that, when sufficiently heated, generates a gas at an interface between the donor area surface in the donor area and the functional material, to transfer the functional material from the at least one donor area by the gas generation onto the receiving substrate;
   a plurality of individually addressable resistive heater elements, each of the individually addressable resistive heater elements being in thermal contact with a respective zone of the cavity forming the at least one donor area; and
   control circuitry configured to supply an electric power having a respective time dependent magnitude to respective ones of the plurality of individually addressable resistive heater elements,
   wherein the resistive heater elements are arranged in a heater matrix comprising:
      a first set of powerlines arranged in a first planar direction of the plate, and
      a second set of powerlines arranged in a second planar direction transverse to the first planar direction; and
   wherein respective heater elements are electrically connected to respective pairs of a powerline of the first set and a powerline of the second set.

2. The transfer device according to claim 1, wherein the functional material has a viscosity of at most 1000 Pa·s.

3. The transfer device according to claim 1, wherein the resistive heater elements are of a material with a negative temperature coefficient or are varistor heater elements.

4. A transfer device for transferring of a functional material, onto a receiving substrate, the device comprising:
   a plate having a donor surface that includes at least one donor area that is formed as a cavity in the donor surface and that is filled with the functional material, the functional material being one selected from the group consisting of: an electric conductor, an electric insulator, a thermal conductor and a thermal insulator, and wherein the functional material has a viscosity of at least 50 Pa·s and a material composition that, when sufficiently heated, generates a gas at an interface between the donor area surface in the donor area and the functional material, to transfer the functional material from the at least one donor area by the gas generation onto the receiving substrate;
   a plurality of individually addressable resistive heater elements, each of the individually addressable resistive heater elements being in thermal contact with a respective zone of the cavity forming the at least one donor area; and
   control circuitry configured to supply an electric power having a respective time dependent magnitude to respective ones of the plurality of individually addressable resistive heater elements,
   wherein the control circuitry is configured to supply the electric power in a plurality of heating cycles,
   wherein the control circuitry, during mutually different phases within a heating cycle, provides a respective one of at least a subset of the plurality of individually addressable heater elements with an electric power, wherein the electric energy provided within a single phase is below a threshold value at which a transfer of the functional material occurs, and the total amount of electric energy provided in the plurality of heating cycles exceeds the threshold value.

5. The transfer device according to claim 4, wherein the functional material has a viscosity of at most 1000 Pa·s.

6. The transfer device according to claim 4, wherein the resistive heater elements are arranged in a heater matrix comprising:
   a first set of powerlines arranged in a first planar direction of the plate, and
   a second set of powerlines arranged in a second planar direction transverse to the first planar direction; and
   wherein respective heater elements are electrically connected to respective pairs of a powerline of the first set and a powerline of the second set.

7. The transfer device according to claim 6, wherein the resistive heater elements are of a material with a negative temperature coefficient or are varistor heater elements.

8. A transfer device for transferring of a functional material, onto a receiving substrate, the device comprising:
   a plate having a donor surface that includes at least one donor area that is formed as a cavity in the donor surface and that is filled with the functional material, the functional material being one selected from the group consisting of: an electric conductor, an electric insulator, a thermal conductor and a thermal insulator, and wherein the functional material has a viscosity of at least 50 Pa·s and a material composition that, when sufficiently heated, generates a gas at an interface between the donor area surface in the donor area and the functional material, to transfer the functional material from the at least one donor area by the gas generation onto the receiving substrate;
   a plurality of individually addressable resistive heater elements, each of the individually addressable resistive heater elements being in thermal contact with a respective zone of the cavity forming the at least one donor area; and
   control circuitry configured to supply an electric power having a respective time dependent magnitude to respective ones of the plurality of individually addressable resistive heater elements,
   wherein the transfer device is configured to move the plate and the receiving substrate relative to each other while in the process of transferring functional material from the at least one donor area, a first portion thereof already adheres to the receiving substrate while another portion thereof remains adhered to the plate surface in the donor area.

9. The transfer device according to claim 8, wherein the functional material has a viscosity of at most 1000 Pa·s.

10. The transfer device according to claim 8, wherein the resistive heater elements are arranged in a heater matrix comprising:
    a first set of powerlines arranged in a first planar direction of the plate, and
    a second set of powerlines arranged in a second planar direction transverse to the first planar direction; and
    wherein respective heater elements are electrically connected to respective pairs of a powerline of the first set and a powerline of the second set.

11. The transfer device according to claim 10, wherein the resistive heater elements are of a material with a negative temperature coefficient or are varistor heater elements.

12. A transfer device for transferring of a functional material, onto a receiving substrate, the device comprising:
    a plate having a donor surface that includes at least one donor area that is formed as a cavity in the donor surface and that is filled with the functional material, the functional material being one selected from the group consisting of: an electric conductor, an electric insulator, a thermal conductor and a thermal insulator, and wherein the functional material has a viscosity of at least 50 Pa·s and a material composition that, when sufficiently heated, generates a gas at an interface between the donor area surface in the donor area and the functional material, to transfer the functional material from the at least one donor area by the gas generation onto the receiving substrate;
    a plurality of individually addressable resistive heater elements, each of the individually addressable resistive heater elements being in thermal contact with a respective zone of the cavity forming the at least one donor area; and
    control circuitry configured to supply an electric power having a respective time dependent magnitude to respective ones of the plurality of individually addressable resistive heater elements,
    wherein the plurality of individually addressable heater elements are arranged in successive zones of the at least one donor area,
    wherein the control circuitry is configured to sequentially supply an electric power to a respective one of the plurality of individually addressable heater elements, and
    wherein a non-linear relationship exists between a rank of the individually addressable heater elements in the succession and a point in time at which a supply of electric power is initiated to a particular addressed one of the individually addressable heater elements.

13. The transfer device according to claim 12, wherein the successive zones include at least a first zone, a one but last zone and a last zone, wherein the control circuitry is configured to postpone initiating a supply of electric power to the heater element heating the last zone with a delay period after having supplied an electric power to the heater element of the one—but last zone.

14. The transfer device according to claim 12, wherein the zones include at least a first zone, a one but first zone, a central zone, a one but last zone and a last zone, the control circuitry being configured to sequentially perform:
    supplying an electric power to the resistive heater elements of the first and the last zone to eject sections of the viscous functional material therein, thus allowing sections corresponding to the first zone and the last zone to fold towards each other;
    pulse-wise supplying an electric power to the heater elements associated with the one but first zone and the one but last zone to gradually release sections of the viscous functional material in the one but first zone and the one but last zone, thus allowing sections corresponding to the one but first zone and the one but last zone to fold towards each other; and
    supplying an electric power to the heater element associated with the central zone to eject folded functional material arising from the supplying an electric power to the resistive heater elements of the first and the last zone and pulse-wise supplying an electric power to the heater elements associated with the one but first zone and the one but last zone.

15. The transfer device according to claim 12, wherein the functional material has a viscosity of at most 1000 Pa·s.

16. The transfer device according to claim 12, wherein the resistive heater elements are arranged in a heater matrix comprising:
- a first set of powerlines arranged in a first planar direction of the plate, and
- a second set of powerlines arranged in a second planar direction transverse to the first planar direction; and
- wherein respective heater elements are electrically connected to respective pairs of a powerline of the first set and a powerline of the second set.

17. The transfer device according to claim 16, wherein the resistive heater elements are of a material with a negative temperature coefficient or are varistor heater elements.

* * * * *